(12) United States Patent
Miura

(10) Patent No.: US 8,884,309 B2
(45) Date of Patent: Nov. 11, 2014

(54) AC SWITCH HAVING COMPOUND SEMICONDUCTOR MOSFETS

(75) Inventor: Mineo Miura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 89 days.

(21) Appl. No.: 13/151,593

(22) Filed: Jun. 2, 2011

(65) Prior Publication Data

US 2011/0297964 A1 Dec. 8, 2011

(30) Foreign Application Priority Data

Jun. 3, 2010 (JP) ................. 2010-128002

(51) Int. Cl.
| | | |
|---|---|---|
| *H01L 29/15* | (2006.01) | |
| *H03K 17/687* | (2006.01) | |
| *H01L 25/065* | (2006.01) | |
| *H01L 23/00* | (2006.01) | |
| *H01L 29/45* | (2006.01) | |
| *H01L 29/78* | (2006.01) | |
| *H01L 23/62* | (2006.01) | |
| *H03K 17/082* | (2006.01) | |
| *H01L 29/16* | (2006.01) | |

(52) U.S. Cl.
CPC .. *H03K 17/6874* (2013.01); *H01L 2224/48091* (2013.01); *H01L 29/45* (2013.01); *H01L 29/7815* (2013.01); *H01L 2924/0105* (2013.01); *H01L 2224/4903* (2013.01); *H01L 2924/04941* (2013.01); *H01L 23/62* (2013.01); *H01L 29/7813* (2013.01); *H01L 2224/48137* (2013.01); *H01L 2924/01033* (2013.01); *H01L 2924/01006* (2013.01); *H01L 2924/01082* (2013.01); *H01L 2924/01013* (2013.01); *H01L 2224/49111* (2013.01); *H01L 29/7802* (2013.01); *H01L 2924/01029* (2013.01); *H01L 2924/10272* (2013.01); *H01L 25/0655* (2013.01); *H03K 17/0822* (2013.01); *H03K 2217/0009* (2013.01); *H01L 2224/48227* (2013.01); *H01L 2224/8592* (2013.01); *H01L 29/1608* (2013.01); *H01L 24/48* (2013.01); *H01L 2924/01023* (2013.01); *H01L 2924/13091* (2013.01); *H01L 24/49* (2013.01)
USPC ................................ 257/77; 361/5; 361/101

(58) Field of Classification Search
USPC ........................................................ 257/77
See application file for complete search history.

(56) References Cited

U.S. PATENT DOCUMENTS

| | | | | |
|---|---|---|---|---|
| 3,474,307 | A * | 10/1969 | Abe Zenmon et al. | 257/256 |
| 4,429,339 | A * | 1/1984 | Jaeschke et al. | 361/93.7 |
| 4,888,504 | A * | 12/1989 | Kinzer | 327/377 |
| 5,682,057 | A * | 10/1997 | Kuriyama | 257/529 |
| 6,238,980 | B1 * | 5/2001 | Ueno | 438/268 |
| 2008/0143421 | A1 | 6/2008 | Yanagihara et al. | |

FOREIGN PATENT DOCUMENTS

| | | | | |
|---|---|---|---|---|
| EP | 660501 A1 * | 6/1995 | ............... | H02P 9/08 |
| JP | 08-55960 A | 2/1996 | | |
| JP | 09-037562 | 2/1997 | | |
| JP | 2002-314086 A | 10/2002 | | |
| JP | 2006-319213 A | 11/2006 | | |
| JP | 2008-153748 A | 7/2008 | | |

* cited by examiner

*Primary Examiner* — Allen Parker

(74) *Attorney, Agent, or Firm* — Rabin & Berdo, P.C.

(57) ABSTRACT

An AC switch includes a first compound semiconductor MOSFET and a second compound semiconductor MOSFET whose sources are connected with each other, a first output terminal connected to the drain of the first compound semiconductor MOSFET, and a second output terminal connected to the drain of the second compound semiconductor MOSFET. The withstand voltage between the first output terminal and the second output terminal in an off state is not less than 400 V. The resistance between the first output terminal and the second output terminal in an on state is not more than 20 mΩ.

16 Claims, 9 Drawing Sheets

AC SWITCH HAVING COMPOUND SEMICONDUCTOR MOSFETS

BACKGROUND OF THE INVENTION

1. Field of the Invention

The present invention relates to an AC switch capable of conducting/interrupting a bidirectional current.

2. Description of Related Art

A hybrid vehicle or an electric vehicle includes an electric motor driven by power supplied from a battery as a driving source. More specifically, a capacitor and an inverter are parallelly connected to a main battery, and the electric motor is driven by power supplied from the inverter. When the vehicle decelerates, a regenerative current generated by the electric motor charges the main battery through the inverter. A relay unit is connected between the main battery and the capacitor and the inverter.

A first function required to the relay unit is that of switching on/off a current supplied from the main battery to the electric motor. A second function required to the relay unit is that of switching on/off the regenerative current (a current in the reverse direction) supplied from the electric motor to the main battery. In other words, the relay unit must be capable of switching on/off a bidirectional current. Further, the relay unit must be capable of ensuring insulating properties with a direct current of 400 V when it is in the off state, and capable of continuous conduction of 60 amperes when it is in the on state, for example.

According to a typical prior art, the relay unit is formed by combining mechanical contact relays. More specifically, the relay unit includes a plus-side main relay connected to the positive pole of the main battery and a minus-side main relay connected to the negative pole of the main battery. A series circuit of a precharging relay and a current limiting resistor is parallelly connected to the plus-side main relay. All of the relays are mechanical contact relays. The precharging relay conducts in advance to the plus-side main relay when the key is put in the ignition, to precharge the capacitor with a current limited by the current limiting resistor. Thus, a rush current following subsequent conduction of the plus-side main relay is suppressed.

SUMMARY OF THE INVENTION

A mechanical contact relay has problems such as chattering, an operating sound, melting/fixation of a contact caused by an overcurrent, reduction of reliability resulting from abrasion of the contact and the like. The problem of melting/fixation of the contact can be eased by reducing a rush current with the aforementioned precharging relay and the current limiting resistor. When including the precharging relay and the current limiting resistor, however, the relay unit is increased in size and weight. While the contact can be protected from an overcurrent by employing a fuse, the fuse must be exchanged when it burns out.

The problems in the mechanical contact relay can be solved by employing a semiconductor relay.

In order to attain a withstand voltage of not less than 400 V with a silicon semiconductor switch, however, the chip size is increased, leading to a new problem such that on-resistance is increased accordingly. More specifically, while the contact resistance of the mechanical contact relay is not more than about 20 mΩ, a silicon semiconductor switch having a withstand voltage of not less than 400 V cannot implement similar on-resistance. Therefore, a semiconductor relay (an AC switch) employable as a bidirectional switch to which a withstand voltage of not less than 400 V is required has not yet been provided.

Accordingly, the present invention provides an AC switch (a semiconductor relay) applicable to a use requiring a high withstand voltage.

Other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
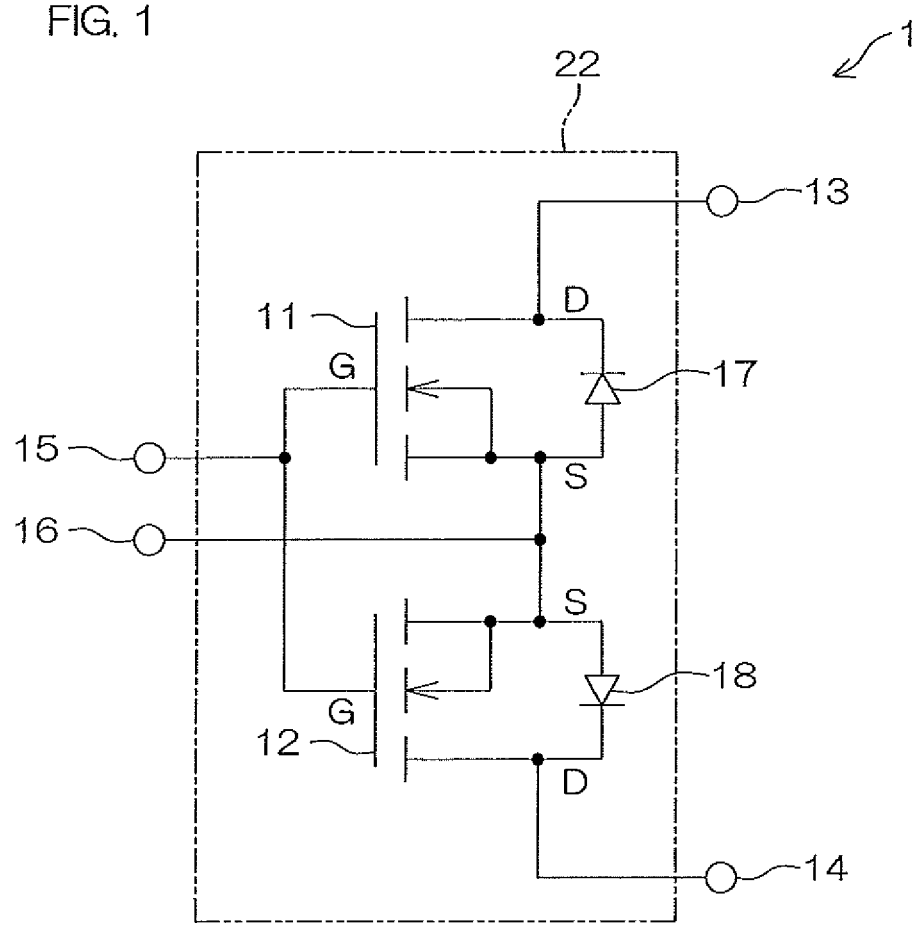
FIG. 1 is an electric circuit diagram of an AC switch according to a first embodiment of the present invention.

An AC switch according to a first embodiment of the present invention includes a first compound semiconductor MOSFET (Metal-Oxide-Semiconductor Field-Effect Transistor) and a second compound semiconductor MOSFET whose sources are connected with each other, a first output terminal connected to the drain of the first compound semiconductor MOSFET, and a second output terminal connected to the drain of the second compound semiconductor MOSFET. The withstand voltage between the first output terminal and the second output terminal in an off state is not less than 400 V (more preferably, not less than 600 V). The resistance between the first output terminal and the second output terminal in an on state is not more than 20 mΩ (more preferably, not more than 10 mΩ).

According to this structure, the sources of the first compound semiconductor MOSFET and the second compound semiconductor MOSFET are connected with each other, and the drains of the first compound semiconductor MOSFET and the second compound semiconductor MOSFET are connected to the first output terminal and the second output terminal respectively. Thus, a current flowing between the first and second output terminals can be switched on/off regardless of the direction thereof. In other words, the first and second compound semiconductor MOSFETs are serially connected with each other in reverse directions, whereby a current path passing through a body diode of each MOSFET is interrupted by the other MOSFET. Thus, an AC switch capable of interrupting a bidirectional current is constituted.

On the other hand, a MOSFET made of a compound semiconductor has low on-resistance per unit area, and hence the chip size thereof is not increased when the withstand voltage is set to not less than 400 V (more preferably, not less than 600 V). Therefore, on-resistance of not more than 20 mΩ (more preferably, not more than 10 mΩ) can be implemented. Consequently, an AC switch applicable to a use requiring a high withstand voltage can be provided.

Examples of the compound semiconductor include SiC and GaN. A MOSFET made of such a compound semiconductor has low on-resistance per unit area. If MOSFETs made of such a compound semiconductor are applied to the first and second compound semiconductor MOSFETs, therefore, an AC switch having a high withstand voltage and low on-resistance can be implemented.

The first compound semiconductor MOSFET may include a plurality of parallelly connected first compound semiconductor MOSFET devices (chips), depending on the required on-resistance. Similarly, the second compound semiconductor MOSFET may include a plurality of parallelly connected second compound semiconductor MOSFET devices (chips). Thus, the on-resistance can be reduced while keeping the withstand voltage.

The AC switch may further include an input terminal (a gate terminal) connected to the gate of the first compound semiconductor MOSFET and the gate of the second compound semiconductor MOSFET. The AC switch may further include an input terminal (a source terminal) connected to the source of the first compound semiconductor MOSFET and the source of the second compound semiconductor MOSFET. Thus, a current path between the first and second output terminals can be switched on/off or the quantity of a current flowing between the first and second output terminals can be controlled by applying a control voltage between the gates and the sources of the first and second compound semiconductor MOSFETs.

Preferably, the first compound semiconductor MOSFET and the second compound semiconductor MOSFET are SiC-MOSFETs employing SiC (silicon carbide) as the compound semiconductor. An AC switch having a high withstand voltage and low on-resistance can be implemented by applying the MOSFETs employing the SiC semiconductor to the first and second compound semiconductor MOSFETs.

The first compound semiconductor MOSFET and the second compound semiconductor MOSFET may be planar MOSFETs. The first compound semiconductor MOSFET and the second compound semiconductor MOSFET may be trench gate MOSFETs. The number of cells per unit area can be increased in a trench gate MOSFET, whereby low on-resistance can be implemented with a small chip size.

Preferably, the AC switch further includes a current control circuit connected to the gate of the first compound semiconductor MOSFET and the gate of the second compound semiconductor MOSFET. According to this structure, the quantity of the current between the first and second output terminals can be controlled.

Preferably, the AC switch further includes a command signal input terminal connected to the current control circuit, and the current control circuit is arranged to respond to a command signal input in the command signal input terminal.

Preferably, the current control circuit is arranged to gradually change a control voltage supplied to the gates of the first compound semiconductor MOSFET and the second compound semiconductor MOSFET. According to this structure, the control voltage supplied to the gates of the first and second compound semiconductor MOSFETs gradually changes, whereby change in the current flowing between the first and second output terminals can be slowed down. When turning on the AC switch, the quantity of a rush current can be reduced by gradually changing the control voltage from an OFF-state voltage to an ON-state voltage, for example. When turning off the AC switch, the control voltage may be instantaneously changed from the ON-state voltage to the OFF-state voltage. Thus, the current path between the first and second output terminals can be quickly cut off.

Preferably, at least one of the first compound semiconductor MOSFET and the second compound semiconductor MOSFET includes a current detection portion for detecting a conduction current. According to this structure, an AC switch having a current detecting function of detecting the current flowing between the first and second output terminals can be provided.

Preferably, the current detection portion includes a terminal to which a source current is partially shunted. According to this structure, the current flowing between the first and second output terminals can be detected with a simple structure.

Preferably, the AC switch further includes an overcurrent protection circuit supplying a current reduction signal to the gates of the first compound semiconductor MOSFET and the second compound semiconductor MOSFET in response to a current, detected by the current detection portion, exceeding a set value. According to this structure, an overcurrent can be prevented from flowing between the first and second output terminals. If a circuit such as a load connected to the first and second output terminals is short-circuited, for example, the overcurrent protection circuit cuts off the first and second compound semiconductor MOSFETs, whereby a short-circuit current can be quickly interrupted.

Preferably, the first compound semiconductor MOSFET and the second compound semiconductor MOSFET as well as the overcurrent protection circuit are stored in one module case. According to this structure, a small AC switch having an overcurrent protecting function can be provided.

An AC switch according to a second embodiment of the present invention includes a first compound semiconductor MOSFET and a second compound semiconductor MOSFET whose sources are connected with each other, a first output terminal connected to the drain of the first compound semiconductor MOSFET, a second output terminal connected to the drain of the second compound semiconductor MOSFET, and a current control circuit connected to the gate of the first compound semiconductor MOSFET and the gate of the second compound semiconductor MOSFET.

According to this structure, an AC switch implementing a high withstand voltage and low on-resistance with the compound semiconductor MOSFETs and having a function of controlling a current flowing between the first and second output terminals can be provided.

Preferably, the AC switch according to the second embodiment further includes a command signal input terminal connected to the current control circuit, and the current control circuit is arranged to respond to a command signal input in the command signal input terminal.

Preferably in the AC switch according to the second embodiment, the current control circuit is arranged to gradually change a control voltage supplied to the gates of the first compound semiconductor MOSFET and the second compound semiconductor MOSFET. According to this structure, the control voltage supplied to the gates of the first and second compound semiconductor MOSFETs gradually changes, whereby change in the current flowing between the first and second output terminals can be slowed down. When turning on the AC switch, the quantity of a rush current can be reduced by gradually changing the control voltage from an OFF-state voltage to an ON-state voltage, for example. When turning off the AC switch, the control voltage may be instantaneously changed from the ON-state voltage to the OFF-state voltage. Thus, a current path between the first and second output terminals can be quickly cut off.

Preferably in the AC switch according to the second embodiment, at least one of the first compound semiconductor MOSFET and the second compound semiconductor MOSFET includes a current detection portion for detecting a conduction current. According to this structure, an AC switch having a current detecting function of detecting the current flowing between the first and second output terminals can be provided.

Preferably, the AC switch according to the second embodiment further includes an overcurrent protection circuit supplying a current reduction signal to the gates of the first compound semiconductor MOSFET and the second compound semiconductor MOSFET in response to a current, detected by the current detection portion, exceeding a set value. According to this structure, an overcurrent can be prevented from flowing between the first and second output terminals. If a circuit such as a load connected to the first and second output terminals is short-circuited, for example, the overcurrent protection circuit cuts off the first and second compound semiconductor MOSFETs, whereby a short-circuit current can be quickly interrupted.

An AC switch according to a third embodiment of the present invention includes a first compound semiconductor MOSFET and a second compound semiconductor MOSFET whose sources are connected with each other, a first output terminal connected to the drain of the first compound semiconductor MOSFET, and a second output terminal connected to the drain of the second compound semiconductor MOSFET, and at least one of the first compound semiconductor MOSFET and the second compound semiconductor MOSFET includes a current detection portion for detecting a conduction current. According to this structure, an AC switch implementing a high withstand voltage and low on-resistance with the compound semiconductor MOSFETs and having a function of detecting a current flowing between the first and second output terminals can be provided.

The AC switch according to the third embodiment may further include an input terminal (a gate terminal) connected to the gate of the first compound semiconductor MOSFET and the gate of the second compound semiconductor MOSFET. The AC switch may further include an input terminal (a source terminal) connected to the source of the first compound semiconductor MOSFET and the source of the second compound semiconductor MOSFET. Thus, a current path between the first and second output terminals can be switched on/off or the quantity of the current flowing between the first and second output terminals can be controlled by applying a control voltage between the gates and the sources of the first and second compound semiconductor MOSFETs.

Preferably in the AC switch according to the third embodiment, the current detection portion includes a terminal to which a source current is partially shunted. According to this structure, the current flowing between the first and second output terminals can be detected with a simple structure.

Preferably, the AC switch according to the third embodiment further includes an overcurrent protection circuit supplying a current reduction signal to the gates of the first compound semiconductor MOSFET and the second compound semiconductor MOSFET in response to a current, detected by the current detection portion, exceeding a set value. According to this structure, an overcurrent can be prevented from flowing between the first and second output terminals. If a circuit such as a load connected to the first and second output terminals is short-circuited, for example, the overcurrent protection circuit cuts off the first and second compound semiconductor MOSFETs, whereby a short-circuit current can be quickly interrupted.

Preferably in the AC switch according to the third embodiment, the first compound semiconductor MOSFET and the second compound semiconductor MOSFET as well as the overcurrent protection circuit are stored in one module case. According to this structure, a small AC switch having an overcurrent protecting function can be provided.

The embodiments of the present invention are now described in detail with reference to the attached drawings.

First Embodiment

FIG. 1 is an electric circuit diagram of an AC switch 1 according to the first embodiment of the present invention. The AC switch 1 includes a first compound semiconductor MOSFET 11, a second compound semiconductor MOSFET 12, a first output terminal 13, a second output terminal 14, a gate terminal 15 and a source terminal 16. The first compound semiconductor MOSFET 11 and the second compound semiconductor MOSFET 12 are serially connected between the first output terminal 13 and the second output terminal 14 while the sources thereof are connected with each other. In other words, the first compound semiconductor MOSFET 11 and the second compound semiconductor MOSFET 12 are serially connected in directions reverse to each other. The gates (G) of the first and second compound semiconductor MOSFETs 11 and 12 are connected to the gate terminal 15 in common. The sources (S) of the first and second compound semiconductor MOSFETs 11 and 12 are connected to the source terminal 16. The drain (D) of the first compound semiconductor MOSFET 11 is connected to the first output terminal 13, while the drain (D) of the second compound semiconductor MOSFET 12 is connected to the second output terminal 14.

The first compound semiconductor MOSFET 11 and the second compound semiconductor MOSFET 12 have body diodes 17 and 18, which are parasitic diodes, respectively. The body diodes 17 and 18 are so formed that the source (S) sides of the first and second compound semiconductor MOSFETs 11 and 12 serve as anodes and the drain (D) sides thereof serve as cathodes.

The first compound semiconductor MOSFET 11 and the second compound semiconductor MOSFET 12 are SiC devices employing SiC (silicon carbide), which is an example of a compound semiconductor, as a semiconductor material, for example. The first compound semiconductor MOSFET 11 and the second compound semiconductor MOSFET 12 are so formed that a withstand voltage between the first and second output terminals 13 and 19 is not less than 400 V (more preferably, not less than 600 V) when both of the first and second compound semiconductor MOSFETs 11 and 12 are in their off states. Further, the first compound semiconductor MOSFET 11 and the second compound semiconductor MOSFET 12 are so formed that resistance (on-resistance) between the first and second output terminals 13 and 14 is not more than 20 mΩ (more preferably, not more than 10 mΩ) when both of the first and second compound semiconductor MOSFETs 11 and 12 are in their on states. The aforementioned withstand voltage in the off state and on-resistance can be implemented by employing the SiC devices as the first and second compound semiconductor MOSFETs 11 and 12.

While the electric circuit diagram of FIG. 1 shows one circuit symbol for the first compound semiconductor MOSFET 11 and one circuit symbol for the second compound semiconductor MOSFET 12, each of the first and second compound semiconductor MOSFETs 11 and 12 may be formed by parallelly connecting a plurality of MOSFET devices, depending on the on-resistance to be implemented.

According to the first embodiment, the first compound semiconductor MOSFET 11 and the second compound semiconductor MOSFET 12 are formed by n-channel FETs (Field-Effect Transistors). When a prescribed OFF-state voltage (0 V, for example) is supplied between the gate terminal 15 and the source terminal 16, both of the first compound semiconductor MOSFET 11 and the second compound semiconductor MOSFET 12 are in off states. The body diodes 17 and 18 are connected in the directions reverse to each other, and hence no current flows between the first output terminal 13 and the second output terminal 14. When a prescribed ON-state voltage (18 V, for example) is supplied between the gate terminal 15 and the source terminal 16, on the other hand, both of the first compound semiconductor MOSFET 11 and the second compound semiconductor MOSFET 12 are turned on. Thus, the first output terminal 13 and the second output terminal 14 conduct, to form a current path passing through the first and second compound semiconductor MOSFETs 11 and 12. In other words, the current path between the first output terminal 13 and the second output terminal 14 can be switched on/off by supplying an OFF-state potential (0 V, for example) or an ON-state potential (18 V, for example) to the gate terminal 15 with reference to the potential of the source terminal 16. When a control potential intermediate between the OFF-state potential and the ON-state potential is supplied to the gate terminal 15, a current according to the level of the control potential can be fed to the first and second compound semiconductor MOSFETs 11 and 12.

Figure 2A:
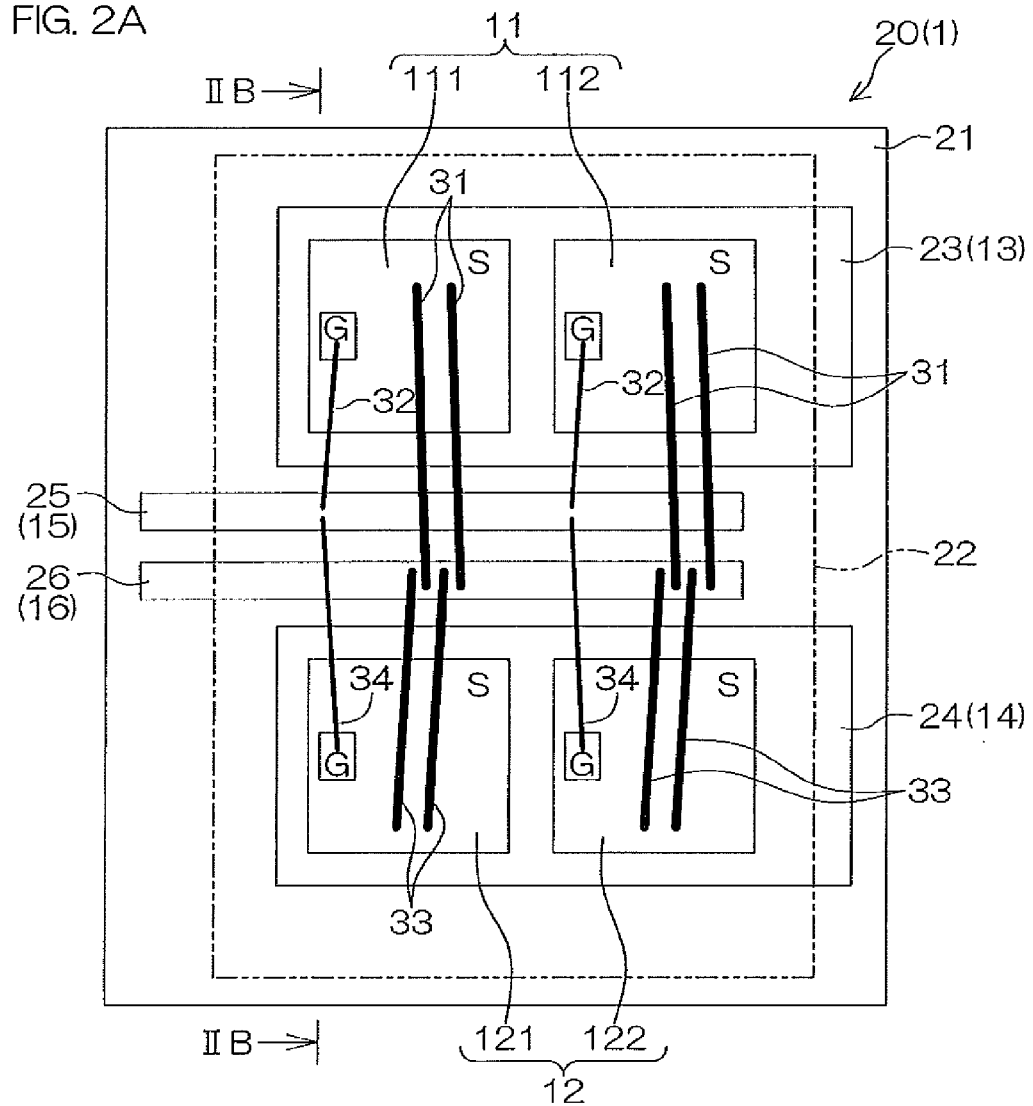
FIG. 2A is a schematic plan view showing a first structural example of the AC switch according to the first embodiment.
Figure 2B:
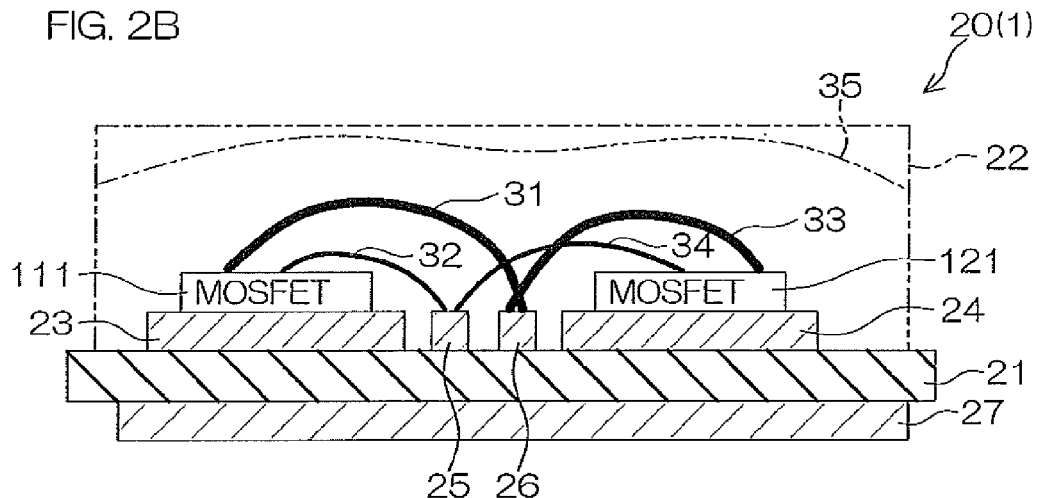
FIG. 2B is a schematic sectional view showing a cutting plane taken along a cutting plane line IIB-IIB in FIG. 2A.

FIG. 2A is a schematic plan view showing a first structural example of the AC switch 1 according to the first embodiment. FIG. 2B is a schematic sectional view showing a cutting plane taken along a cutting plane line IIB-IIB in FIG. 2A. In the first structural example, two first compound semiconductor MOSFET devices (chips) 111 and 112 are parallelly connected with each other, to constitute the first compound semiconductor MOSFET 11 in the electric circuit diagram of FIG. 1. Further, two second compound semiconductor MOSFET devices (chips) 121 and 122 are parallelly connected with each other, to constitute the second compound semiconductor MOSFET 12 in the electric circuit diagram of FIG. 1. All of the compound semiconductor MOSFET devices 111, 112, 121 and 122 may be constituted of SiC devices, and may have generally identical device structures, for example.

The first structural example has a mode of an AC switch module 20 including an insulating substrate 21 and a case 22 fixed to one surface of the insulating substrate 21. The insulating substrate 21 may be made of sapphire, alumina or aluminum nitride, for example. In the first structural example, the insulating substrate 21 is rectangular in plan view. In the first structural example, further, the case 22 is formed by a container in the form of a rectangular parallelepiped opening on the side of the insulating substrate 21, and has a storage space for storing the compound semiconductor MOSFET devices 111, 112, 121 and 122 etc. therein.

A drain metal pattern 23 constituting the first output terminal 13 and a second drain metal pattern 24 constituting the second output terminal 14 are formed on one surface of the insulating substrate 21. The first and second drain metal patterns 23 and 24 are in the form of long rectangles extending in a direction parallel to one side of the insulating substrate 21, and extend parallelly to each other at an interval. A gate metal pattern 25 and a source metal pattern 26 are parallelly formed between the first drain metal pattern 23 and the second drain metal pattern 24, in parallel with the first and second drain metal patterns 23 and 29. The gate metal pattern 25 corresponds to the gate terminal 15 in the electric circuit diagram of FIG. 1, and the source metal pattern 26 corresponds to the source terminal 16 in the electric circuit diagram of FIG. 1. The metal patterns 23 to 26 are made of copper or aluminum, for example. The first drain metal pattern 23 and the second drain metal pattern 24 are drawn out of the case 22 on one side along the longitudinal direction thereof. The gate metal pattern 25 and the source metal pattern 26 are drawn out of the case 22 on the side opposite to the drain metal patterns 23 and 24. Another metal pattern 27 is formed on the overall rear surface of the insulating substrate 21 opposite to the metal patterns 23 to 26.

The first compound semiconductor MOSFET devices 111 and 112 are arranged on the surface of the first drain metal pattern 23, to line up along the longitudinal direction thereof. The first compound semiconductor MOSFET devices 111 and 112 are die-bonded to the first drain metal pattern 23. The first compound semiconductor MOSFET devices 111 and 112 have drain electrodes (metal layers) on the surfaces opposed to the first drain metal pattern 23, and the drain electrodes are bonded to the first drain metal pattern 23. Further, the first compound semiconductor MOSFET devices 111 and 112 have source electrodes (metal layers) and gate electrodes (metal layers) on the surfaces opposite to the first drain metal pattern 23. The source electrodes are electrically connected to the source metal pattern 26 by bonding wires 31. The gate electrodes are electrically connected to the gate metal pattern 25 by bonding wires 32.

The second compound semiconductor MOSFET devices 121 and 122 are arranged along the longitudinal direction of the second drain metal pattern 24, and die-bonded to the second drain metal pattern 29. The second compound semiconductor MOSFET devices 121 and 122 have drain electrodes (metal layers) on the lower surfaces opposed to the second drain metal pattern 24, and the drain electrodes are bonded to the second drain metal pattern 24. Further, the second compound semiconductor MOSFET devices 121 and 122 include source electrodes (metal layers) and gate electrodes (metal layers) on the surfaces opposite to the second drain metal pattern 24. The source electrodes are connected to the source metal pattern 26 by bonding wires 33. The gate electrodes are electrically connected to the gate metal pattern 25 by bonding wires 34.

A fixing material 35 made of an insulating material such as molding resin or silicon gel is arranged in the storage space of the case 22. The fixing material 35 is so arranged in the case 22 as to seal the compound semiconductor MOSFET devices 111, 112, 121 and 122, the bonding wires 31 to 34 and the like.

Figure 3A:
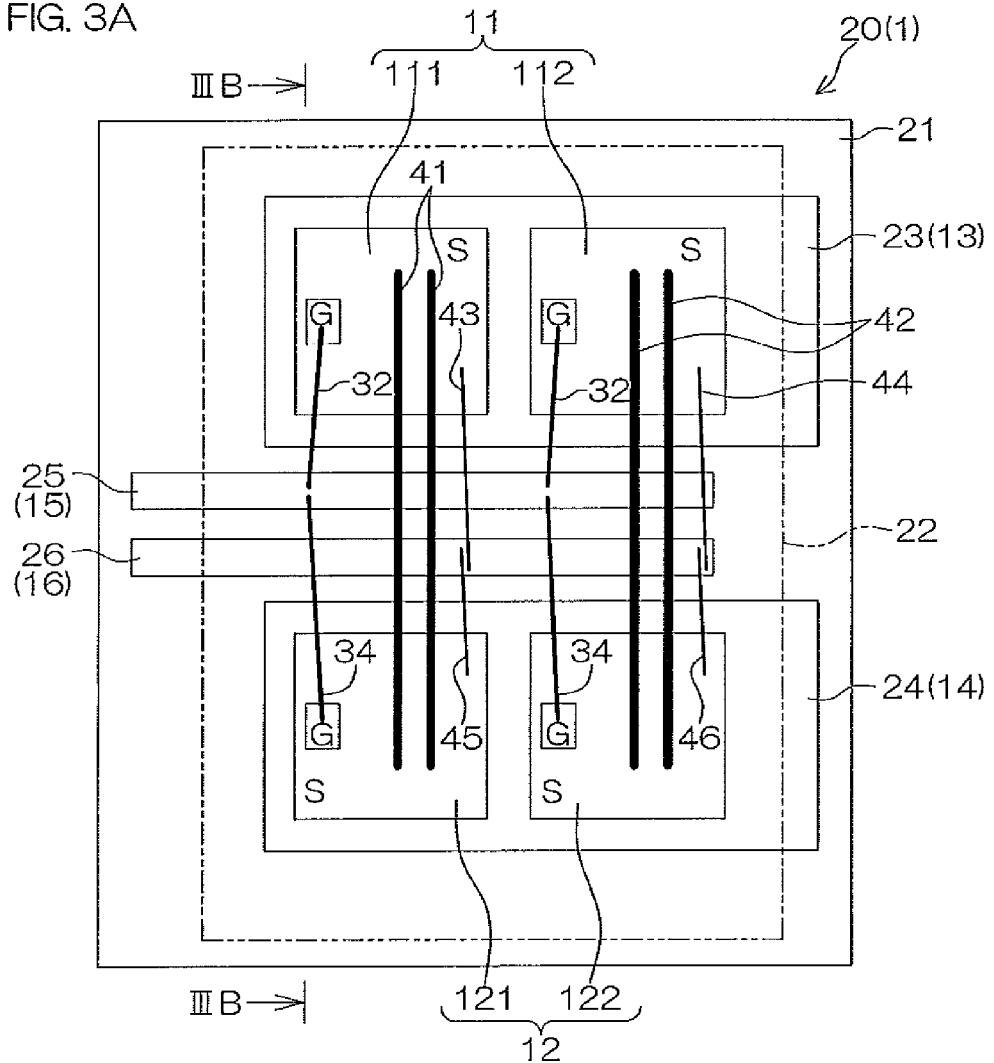
FIG. 3A is a schematic plan view showing a second structural example of the AC switch according to the first embodiment.
Figure 3B:
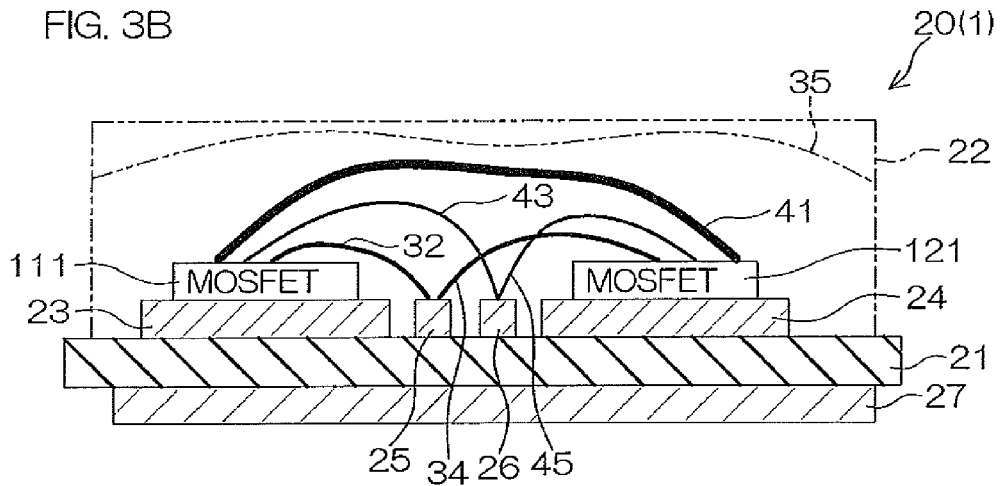
FIG. 3B is a schematic sectional view showing a cutting plane taken along a cutting plane line IIIB-IIIB in FIG. 3A.

FIG. 3A is a schematic plan view showing a second structural example of the AC switch 1 according to the first embodiment. FIG. 3B is a schematic sectional view showing a cutting plane taken along a cutting plane line IIIB-IIIB in FIG. 3A. Referring to FIGS. 3A and 3B, portions corresponding to those shown in FIGS. 2A and 2B are denoted by the same reference numerals. In the second structural example, bonding wires 41 and 42 directly connecting source terminals of first compound semiconductor MOSFET devices 111 and 112 and source terminals of second compound semiconductor MOSFET devices 121 and 122 with one another are added.

More specifically, the bonding wires 41 connect source electrodes of the first and second compound semiconductor MOSFET devices 111 and 121 opposed to each other through a gate metal pattern 25 and a source metal pattern 26. Similarly, the bonding wires 42 connect source electrodes of the first and second compound semiconductor MOSFET devices 112 and 122 opposed to each other through the gate metal pattern 25 and the source metal pattern 26. The source electrodes of the first and second compound semiconductor MOSFET devices 111, 112, 121 and 122 are connected to the source metal pattern 26 by bonding wires 43, 44, 45 and 46.

The AC switch 1 having the electric circuit structure shown in FIG. 1 can be constituted also of this structure.

In each of the aforementioned first and second structural examples, the number of the first compound semiconductor MOSFET devices (chips) 111 and 112 may be not less than three. In other words, the first compound semiconductor MOSFET 11 may be formed by parallelly connecting not less than three first compound semiconductor MOSFET devices with one another. Similarly, the number of the second compound semiconductor MOSFET devices (chips) 121 and 122 may be not less than three, and the second compound semiconductor MOSFET 12 may be formed by parallelly connecting not less than three second compound semiconductor MOSFET devices with one another. The numbers of the parallelly connected compound semiconductor MOSFET devices may be determined in accordance with the required on-resistance.

Figure 4:
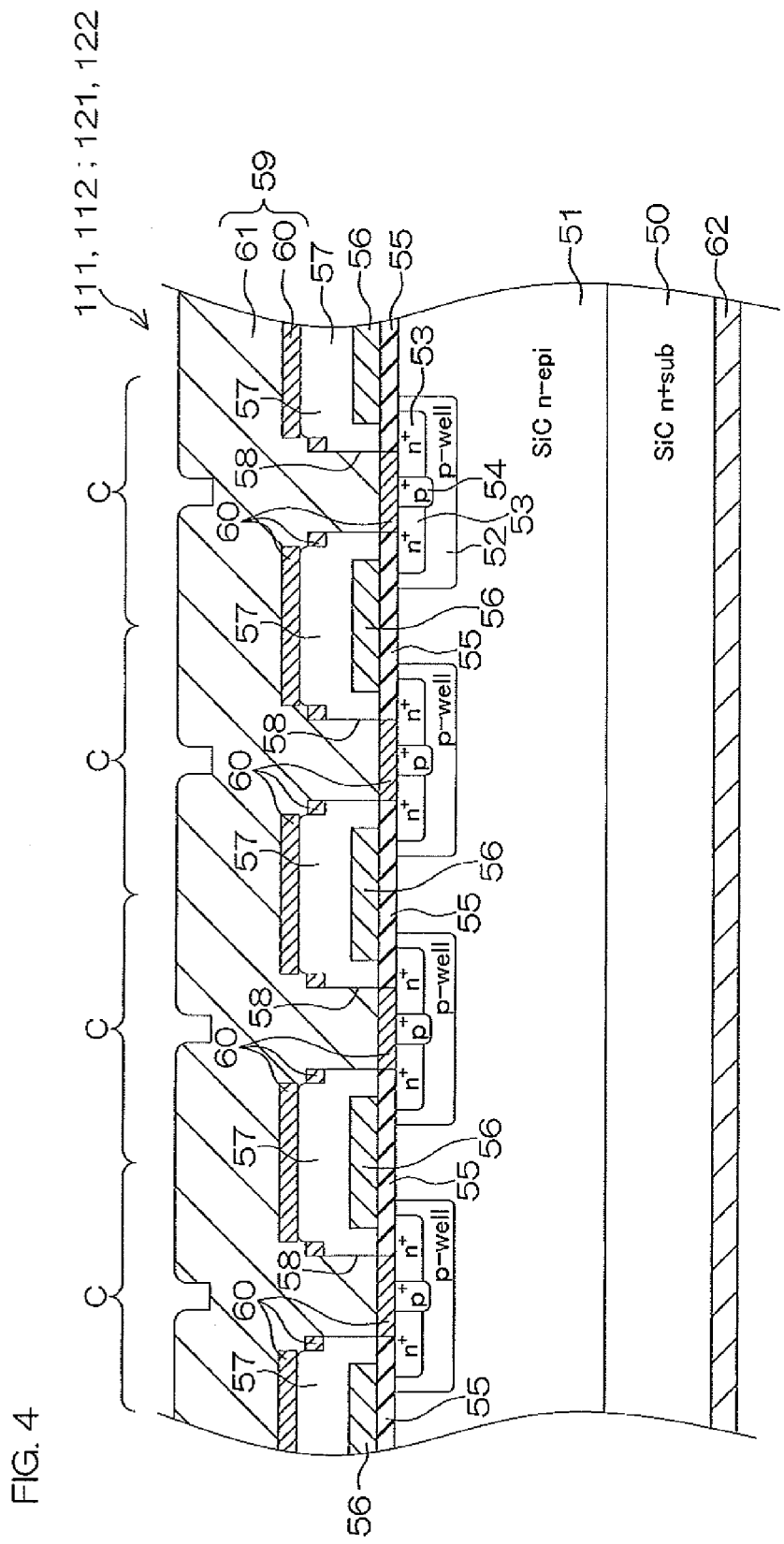
FIG. 4 is a schematic sectional view of a planar MOSFET device, which is a device structure employable as a compound semiconductor MOSFET device.

FIG. 4 is a partially fragmented sectional view showing a structural example of each of the compound semiconductor MOSFET devices 111, 112, 121 and 122. FIG. 4 shows the structure of a planar MOSFET device. Each of the compound semiconductor MOSFET devices 111, 112, 121 and 122 is formed by arraying a large number of unit cells C shown in FIG. 4 in a plane orthogonal to the plane of FIG. 4, for example. The large number of unit cells C are parallelly connected between a source electrode (S: a metal film 59) and a drain (D: a metal film 62), to ensure a necessary gate width.

As to the specific structure of each unit cell C, an n-type epitaxial layer 51 made of an SiC semiconductor is formed on the surface of an $n^+$-type substrate 50 made of an SIC semiconductor, for example. A p-type well 52 is formed on a surface layer portion (a region around the surface) of the n-type epitaxial layer 51. The p-type well 52 is formed on a region rectangular in plan view, for example. An $n^+$-type source region 53 having a smaller thickness than the p-type well 52 is formed on an inner region of the p-type well 52. The $n^+$-type source region 53 is formed to have an annular shape (more specifically, a quadrangular annular shape similar to that of the p-type well 52), for example. A $p^+$-type contact region 54 is formed in a region surrounded by the $n^+$-type source region 53. The $p^+$-type contact region 54 is formed to be in contact with the p-type well 52.

A gate insulating film 55 is formed on the surface of the n-type epitaxial layer 51. The gate insulating film 52 is a silicon oxide film formed by thermal oxidation, for example, and has a thickness of about 400 Å, for example. A polysilicon gate 56 is formed on the surface of the gate insulating film 55. The polysilicon gate 56 is formed on a region extending over the p-type well 52 between the $n^+$-type source region 53 and the n-type epitaxial layer 51 in plan view. More specifically, the polysilicon gate 56 is formed on a region reaching the $n^+$-type source region 53 from outside the p-type well 52 of each unit cell C. The polysilicon gate 56 corresponding to the plurality of unit cells C is in the form of a lattice surrounding the $p^+$-type contact region 54 of each unit cell C.

An inversion layer (a channel) can be formed on the surface of the p-type well 52 between the $n^+$-type source region 53 and the n-type epitaxial layer 51 by supplying a proper control voltage to the polysilicon gate 56. Further, the quantity of a current between the $n^+$-type source region 53 and the n-type epitaxial layer 51 can be adjusted by adjusting the control voltage applied to the polysilicon gate 56.

An interlayer dielectric film 57 made of silicon oxide, for example, is formed to cover the gate insulating film 55 and the polysilicon gate 56. A contact hole 58 is formed in the interlayer dielectric film 57 and the gate insulating film 55, to pass through the same. The contact hole 58 is formed generally at the center of the p-type well 52 in plan view, to partially expose the $p^+$-type contact region 54 and the $n^+$-type source region 53. The metal film 59 constituting the source electrode is embedded in the contact hole 58. The metal film 59 is formed generally over the whole surface of the interlayer insulating film 57 outside the contact hole 58.

The metal film 59 has an islandlike portion divided by etching on an unshown position. The polysilicon gate 56 is connected to the islandlike portion through a gate contact hole (not shown) formed in the interlayer dielectric film 57. In other words, the islandlike portion of the metal film 59 constitutes a gate electrode.

In the structure shown in FIG. 4, the metal film 59 has a barrier film 60 as an underlayer, and a body metal film 61 is stacked on the barrier film 60. The barrier film 60 may be formed by a multilayer film prepared by stacking a titanium (Ti) layer on an underlayer of a titanium nitride (TiN) film, for example. The body metal film 61 can be constituted of a thin film of aluminum (Al) or copper (Cu), for example.

A metal film 62 constituting a drain electrode is formed on the overall rear surface of the $n^+$-type SiC substrate 50 opposite to the n-type epitaxial layer 51.

When an ON-state voltage positive on the side of the polysilicon gate 56 is applied between the source electrode (the metal film 59) and the polysilicon gate 56 in the structure shown in FIG. 4, the source and the drain conduct. In other words, the inversion layer (the channel) is formed on the surface of the p-type well 52 between the $n^+$-type source region 53 and the n-type epitaxial layer 51. Thus, a current path reaching the metal film 62 (the drain electrode) from the metal film (the source electrode) successively through the $n^+$-type source region 53, the p-type well 52 (the channel), the n-type epitaxial layer 51 and the $n^+$-type substrate 50 is formed in each unit cell C. When an OFF-state voltage (0 V, for example) is applied to the polysilicon gate 56, on the other hand, the channel on the surface of the p-type well 52 disappears, and the $n^+$-type source region 53 and the n-type epitaxial layer 51 are cut off from each other. Thus, on-off control operation can be performed in response to the control voltage applied to the polysilicon gate 56. Further, the quantity of the current flowing between the source and the drain can be controlled by supplying a control voltage intermediate between the OFF-state voltage and the ON-state voltage to the polysilicon gate 56.

The withstand voltage of the planar MOSFET device can be set to not less than 400 V by properly designing the n-type epitaxial layer 51. More specifically, a withstand voltage of 400 V can be attained by setting the concentration of an n-type impurity (nitrogen atoms, for example) doped in the n-type epitaxial layer 51 made of the SiC semiconductor to $2 \times 10^{16}$ cm$^{-3}$ and setting the thickness of the n-type epitaxial layer 51 to 4 μm, for example. Further, a withstand voltage of 600 V can be attained by setting the concentration of the n-type impurity in the n-type epitaxial layer 51 made of the SiC semiconductor to $1 \times 10^{16}$ cm$^{-3}$ and setting the thickness of the n-type epitaxial layer 51 to 6 μm, for example. In addition, a withstand voltage of 1200 V can be attained by setting the concentration of the n-type impurity in the n-type epitaxial layer 51 made of the SiC semiconductor to $5 \times 10^{15}$ cm$^{-3}$ and setting the thickness thereof to 10 μm, for example.

A p-n junction is formed between the p-type well 52 and the n-type epitaxial layer 51. The p-n junction forms the body diode 17 or 18 (see FIG. 1). The body diode 17 or 18 conducts when the potential of the source electrode (the metal film 59) is higher than that of the drain electrode (the metal film 62) by not less than a forward voltage VF. However, the first and second compound semiconductor MOSFETs 11 and 12 are switched off at the same time, and hence no current path is formed to pass through the body diodes 17 and 18.

Figure 5:
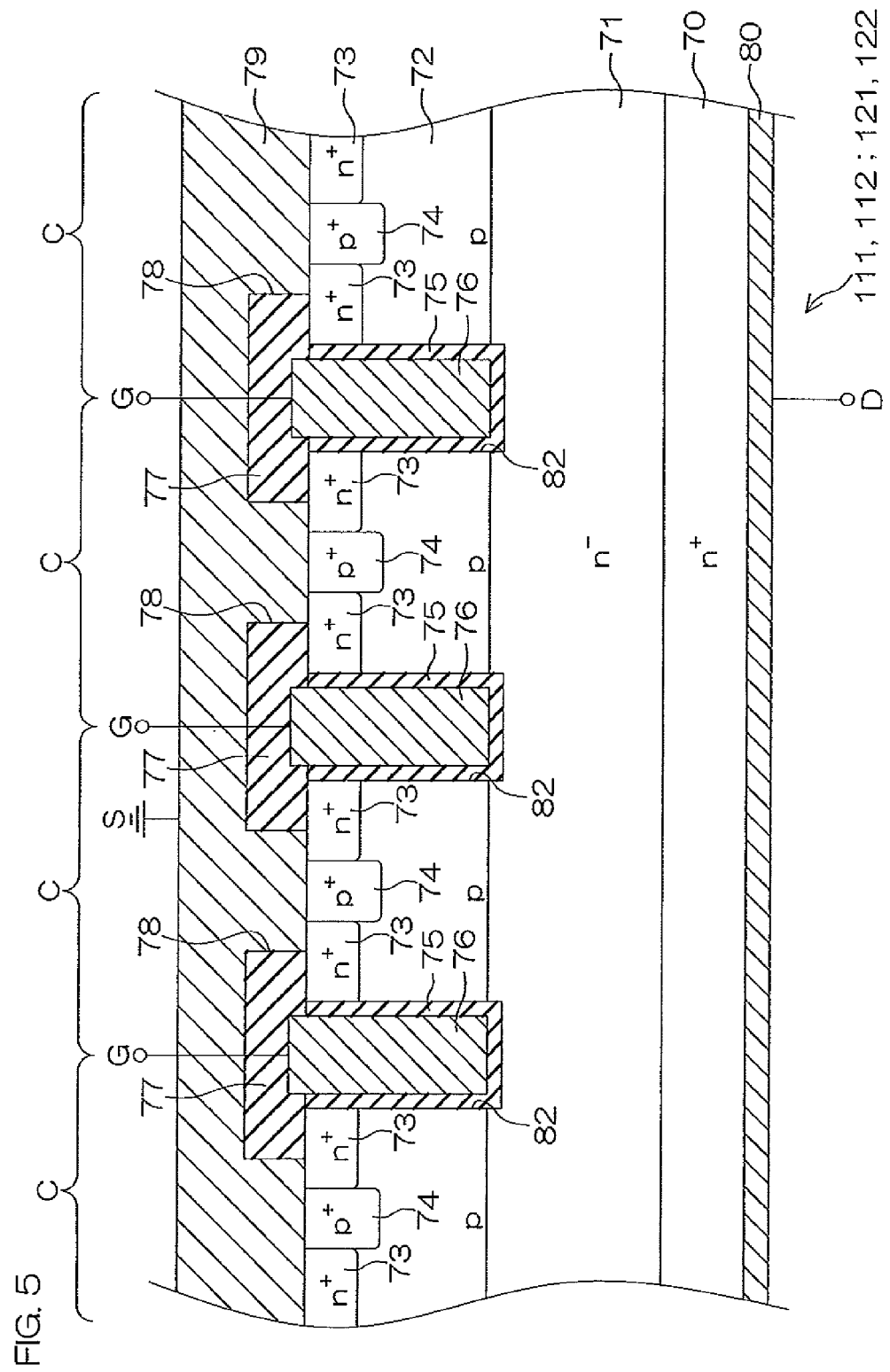
FIG. 5 is a schematic sectional view of a trench gate MOSFET device, which is another device structure employable as a compound semiconductor MOSFET device.

FIG. 5 is a schematic sectional view of a trench gate MOSFET device, which is another device structure employable as each of the compound semiconductor MOSFET devices 111, 112, 121 and 122. Each of the compound semiconductor MOSFET devices 111, 112, 121 and 122 is formed by arraying a large number of unit cells C shown in FIG. 5 in a plane spreading perpendicularly to the plane of FIG. 5, for example. The large number of unit cells C are parallelly connected between a source electrode (S: a metal film 79) and a drain (D: a metal film 80), to ensure a necessary gate width.

As to the specific structure of each unit cell C, an n$^-$-type SiC epitaxial layer 71 is formed on the surface of an n$^+$-type substrate 70 made of an SiC semiconductor, for example. A p-type body layer 72 is further formed on the n$^-$-type epitaxial layer 71. The p-type body layer 72 is formed by ion-implanting aluminum as a p-type impurity into the n$^-$-type epitaxial layer 71, for example.

The p-type body layer 72 is surrounded by a gate trench 82 provided in the form of a lattice in plan view to divide each unit cell C. For example, the gate trench 82 divides the p-type body layer 72 into a rectangular shape in plan view. An n$^+$-type source region 73 is formed on a surface layer portion of the p-type body layer 72 along the gate trench 82. The n$^+$-type source region 73 is formed along the peripheral edge portion of the p-type body layer 72, and hence the same has a rectangular annular shape in plan view when the p-type body layer 72 has the rectangular shape in plan view. A p$^+$-type contact layer 74 is formed on a region surrounded by the n$^+$-type source region 73. The p$^+$-type contact layer 74 is formed to be in contact with the p-type body layer 72.

The gate trench 82 is formed in a depth reaching the n$^-$-type epitaxial layer 71 from the surface of the n$^+$-type source region 73 penetrating through the n$^+$-type source region 73 and the p-type body layer 72. A gate insulating film 75 is formed on the inner wall surface of the gate trench 82. The gate insulating film 75 is a silicon oxide film formed by thermally oxidizing the SiC semiconductor exposed in the gate trench 82, for example, and has a thickness of about 400 Å, for example. A polysilicon gate 76 is embedded in the gate trench 82, to be in contact with the gate insulating film 75. The polysilicon gate 76 is opposed to the p-type body layer 72 between the n$^+$-type source region 73 and the n$^-$-type epitaxial layer 71 through the gate insulating film 75.

An interlayer dielectric film 77 is formed to cover part of the n$^+$-type source region 73 and the upper surface of the polysilicon gate 76. A contact hole 78 partially exposing the n$^+$-type source region 73 and the p-type contact region 74 is formed in the interlayer dielectric film 77. The contact hole 78 is formed generally at the center of the p-type body layer 72 in plan view. The metal film 79 is embedded in the contact hole 78. The metal film 79 is formed generally over the whole surface of the interlayer dielectric film 77 outside the contact hole 78.

The metal film 79 is divided by etching on an unshown position, and has an islandlike isolated region. The islandlike isolated region is connected to the polysilicon gate 76 through a gate contact hole formed in the interlayer dielectric film 77 on an unshown position. In other words, the islandlike region forms a gate electrode (G). The remaining region of the metal film 79 isolated from the islandlike region forms a source electrode (S).

A metal film 80 is formed on the overall rear surface of the n$^+$-type SiC substrate 70 opposite to the n$^-$-type epitaxial layer 71, and the metal film 80 forms a drain electrode (D).

When the polysilicon gate 76 is kept at a potential generally identical to that of the n$^+$-type source region 73, the n$^+$-type source region 73 and the n$^-$-type epitaxial layer are electrically cut off from each other. When the polysilicon gate 76 is set to an ON-state potential higher than that of the n$^+$-type source region 73 by not less than a prescribed threshold, on the other hand, an inversion layer (a channel) is formed on a portion of the p-type body layer 72 opposed to the polysilicon gate 76 through the gate insulating film 75. The n$^+$-type source region 73 and the n$^-$-type epitaxial layer 71 conduct through the channel. Thus, a current path reaching the metal film 80 (the drain electrode) from the metal film 79 (the source electrode) through the n$^+$-type source region 73, the p-type body layer 72, the n$^-$-type epitaxial layer 71 and the n$^+$-type substrate 70 is formed. A p-n junction formed between the p-type body layer 72 and the n$^-$-type epitaxial layer 71 constitutes the body diode 17 or 18 shown in the electric circuit diagram of FIG. 1.

In the trench gate MOSFET, the large number of unit cells C can be densely integrated on the n$^+$-type substrate 70, and a large gate width can responsively be ensured in a small-sized chip. Therefore, necessary on-resistance can be attained in a small chip or a small number of chips.

In order to attain a necessary withstand voltage in an off state, the impurity concentration in and the thickness of the n$^-$-type epitaxial layer 71 may be properly set. More specifically, a withstand voltage of 400 V can be attained by setting the concentration of an n-type impurity (nitrogen atoms, for example) doped in the n$^-$-type epitaxial layer 71 made of the SiC semiconductor to $2 \times 10^{16}$ cm$^{-3}$ and setting the thickness of the n$^-$-type epitaxial layer 71 to 4 μm, for example. Further, a withstand voltage of 600 V can be attained by setting the concentration of the n-type impurity in the n$^-$-type epitaxial layer 71 made of the SiC semiconductor to $1 \times 10^{16}$ cm$^{-3}$ and setting the thickness of the n$^-$-type epitaxial layer 71 to 6 μm, for example. In addition, a withstand voltage of 1200 V can be attained by setting the n-type impurity concentration in the n$^-$-type epitaxial layer 71 made of the SiC semiconductor to $5 \times 10^{15}$ cm$^{-3}$ and setting the thickness thereof to 10 μm, for example.

As hereinabove described, the AC switch 1 according to the first embodiment is formed by serially connecting the first and second compound semiconductor MOSFETs 11 and 12 whose sources are connected with each other between the first and second output terminals 13 and 14. For example, the first and second compound semiconductor MOSFETs 11 and 12 are constituted of the MOSFET devices 111, 112, 121 and 122 employing SiC as the compound semiconductor, whereby on-resistance of not more than 20 mΩ can be implemented with a small chip size or a small number of chips while implementing a withstand voltage of not less than 400 V. This is because a MOSFET device made of a compound semiconductor such as SIC has low on-resistance per unit area. Thus, an AC switch having a high withstand voltage and low on-resistance, not implementable in a semiconductor relay made of a silicon semiconductor, can be provided.

Such an AC switch can be employed for controlling power supply to an electric motor employed as a driving source for a hybrid vehicle or an electric vehicle, for example. In this case, the AC switch causes no problems such as chattering, an operating sound, melting/fixation of a contact, reduction of reliability resulting from abrasion of the contact etc., dissimilarly to a generally employed mechanical contact type relay.

In order to form an AC switch by a semiconductor relay employing a silicon semiconductor, 18 chips must be parallelly connected with one another, for example. In this case, however, wire bonding is extremely complicated, and a necessary withstand voltage cannot be attained if any of the chips breaks down. In practice, therefore, necessary reliability cannot be ensured, and the production cost is so increased that the necessary withstand voltage and necessary on-resistance cannot be implemented. Further, the chip size must be increased in order to implement the necessary withstand voltage, and a large number of such large-sized chips must be employed. Therefore, the AC switch is so increased in size and weight that the same cannot be practically employed for an application such as a hybrid vehicle or an electric vehicle requiring reduction in size and weight, in particular.

On the other hand, an AC switch employing a compound semiconductor such as SiC can implement a necessary withstand voltage with a small chip size. Further, necessary on-resistance can be implemented by parallelly connecting a small number of chips with one another. More specifically, on-resistance of not more than 10 mΩ can be attained by parallelly connecting six chips with one another, for example, when a planar MOSFET device is made of an SiC semiconductor. In a case of a trench gate MOSFET device made of an SiC semiconductor, on the other hand, on-resistance of not more than 10 mΩ can be implemented by parallelly connecting two chips with each other. Thus, a practical semiconductor relay (a practical AC switch) can be provided by employing a compound semiconductor such as SiC.

Second Embodiment

Figure 6:
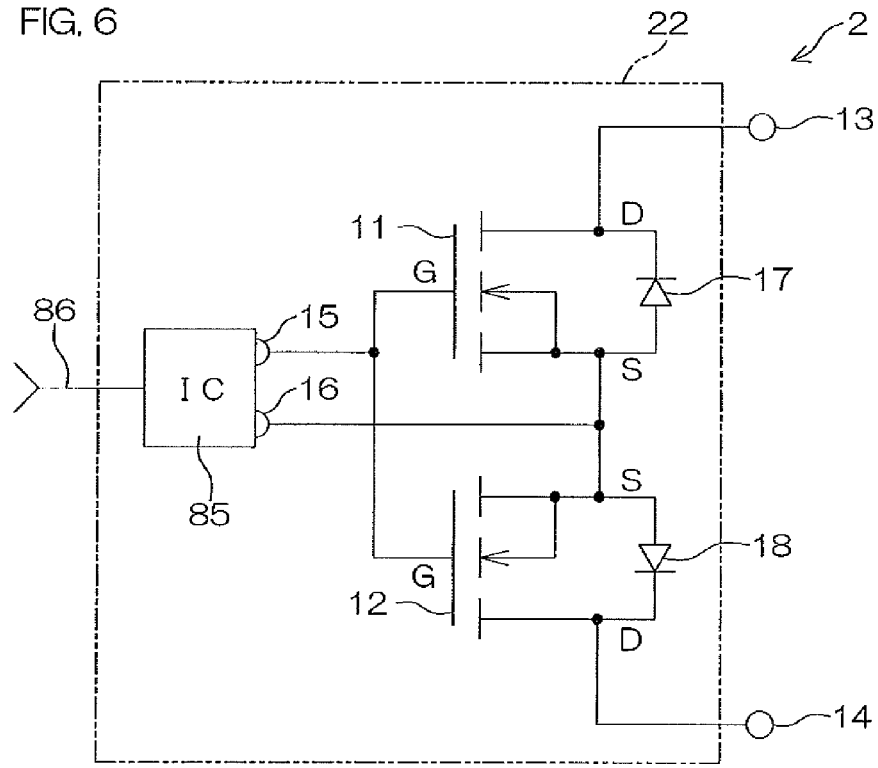
FIG. 6 is an electric circuit diagram showing the structure of an AC switch according to a second embodiment of the present invention.

FIG. 6 is an electric circuit diagram showing the structure of an AC switch 2 according to the second embodiment of the present invention. Referring to FIG. 6, portions corresponding to those shown in FIG. 1 are denoted by the same reference numerals. The AC switch 2 according to the second embodiment includes a current control circuit (a current control IC) 85, in addition to the structure shown in FIG. 1. A gate terminal 15 and a source terminal 16 are connected to the current control circuit 85. The current control circuit 85 is arranged to apply, between the source terminal 16 and the gate terminal 15, a control voltage fluctuating stepwise in not less than three stages or a control voltage generally steplessly settable between an OFF-state voltage and an ON-state voltage. A command signal line (a command signal input terminal) 86 is connected to the current control circuit 85.

When supplied with a cutoff command signal from the command signal line 86, the current control circuit 85 keeps the voltage between the source terminal 16 and the gate terminal 15 at the OFF-state voltage (0 V). Thus, both of first and second compound semiconductor MOSFETs 11 and 12 are switched off, whereby a current path between a first output terminal 13 and a second output terminal 14 is cut off. When receiving a conduction command signal from the command signal line 86, on the other hand, the current control circuit 85 gradually increases the potential of the gate terminal 15 with respect to the source terminal 16 from an OFF-state potential (0 V, for example) to an ON-state potential (18 V, for example). Therefore, the quantity of a current flowing in the first and second compound semiconductor MOSFETs 11 and 12 gradually increases. Thus, a rush current in conduction of the first and second output terminals 13 and 14 can be suppressed, and the current can be gradually fed.

For example, a driving circuit for an electric motor as a driving source of a hybrid vehicle or an electric vehicle includes a capacitor and an inverter parallelly connected to a main battery. The AC switch 2 according to the second embodiment can be interposed between the main battery and the capacitor and the inverter, in order to switch on/off a current path therebetween. The capacitor is not yet charged immediately after conduction of the ignition switch of the vehicle, and hence a large rush current is generated if a mechanical contact relay is employed. When the AC switch 2 according to the second embodiment is employed, on the other hand, a current passing through the first and second compound semiconductor MOSFETs 11 and 12 can be limited in a period for precharging the capacitor. Thus, the main battery and the capacitor and the inverter can be rendered conductive while preventing abrupt flowing of a large current. In other words, the first and second compound semiconductor MOSFETs 11 and 12 can serve as current limiting resistors for precharging the capacitor, due to the provision of the current control circuit 85.

When turning off the AC switch 2, the current control circuit 85 preferably instantaneously changes the control voltage between the source terminal 16 and the gate terminal 15 from the ON-state voltage to the OFF-state voltage. Thus, the current path between the first and second output terminals 13 and 14 can be quickly cut off.

As shown by phantom lines in FIG. 6, the first and second compound semiconductor MOSFETs 11 and 12 as well as the current control circuit 85 are preferably stored in one case 22, to constitute a module having a current control function. Thus, a small AC switch having a current control function can be provided.

Third Embodiment

Figure 7:
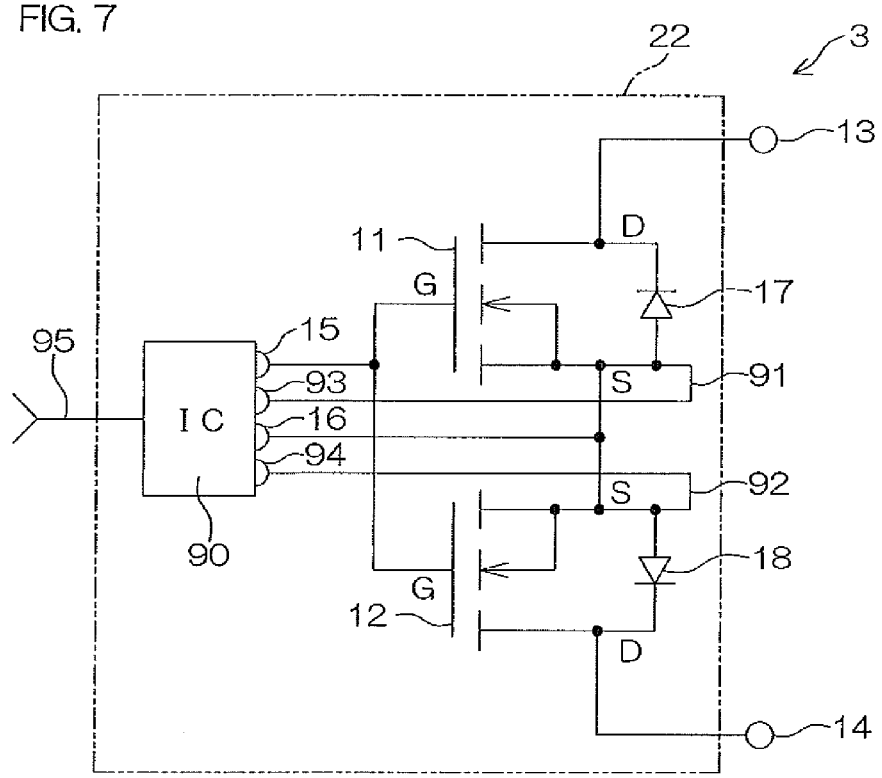
FIG. 7 is an electric circuit diagram for illustrating the structure of an AC switch according to a third embodiment of the present invention.

FIG. 7 is an electric circuit diagram for illustrating the structure of an AC switch 3 according to the third embodiment of the present invention. Referring to FIG. 7, portions corresponding to those shown in FIG. 1 are denoted by the same reference numerals. According to the third embodiment, first and second compound semiconductor MOSFETs 11 and 12 include current detection portions 91 and 92 respectively. Current detection terminals 93 and 94 are connected to the current detection portions 91 and 92 respectively, and also connected to an overcurrent protection circuit (an overcurrent protection IC) 90. The overcurrent protection circuit 90 controls a voltage between a gate terminal 15 and a source terminal 16 in response to a conduction command and a cutoff command received from a command signal line 95. In other words, the gate terminal 15 and the source terminal 16 are connected to the overcurrent protection circuit 90.

When supplied with the cutoff command from the command signal line 95, the overcurrent protection circuit 90 keeps the gate terminal 15 at an OFF-state potential (0 V, for example) with respect to the source terminal 16. When supplied with the conduction command from the command signal line 95, on the other hand, the overcurrent protection circuit 90 sets the gate terminal 15 to an ON-state potential (18 V, for example) with respect to the source terminal 16. Thus, the first and second compound semiconductor MOSFETs 11 and 12 conduct, and a current path between the first and second output terminals 13 and 14 conducts.

If a signal received from the current detection terminal 93 or 94 exceeds a prescribed overcurrent threshold, the overcurrent protection circuit 90 forcibly sets the gate terminal 15 to an OFF-state potential (a current reduction signal) with respect to the source terminal 16, regardless of the command signal from the command signal line 95. Thus, the first and second compound semiconductor MOSFETs 11 and 12 are cut off, whereby the current path between the first and second output terminals 13 and 14 is cut off.

An overcurrent resulting from a short circuit of a load or the like can be quickly interrupted through the functions of the current detection portions 91 and 92 provided on the first and second compound semiconductor MOSFETs 11 and 12 in the aforementioned manner. Thus, the first and second compound semiconductor MOSFETs 11 and 12 can be protected from the overcurrent. Electric or electronic components constituting an electric circuit such as a load connected to the first and second output terminals 13 and 14 are also protected from the overcurrent, as a matter of course.

Figure 8:
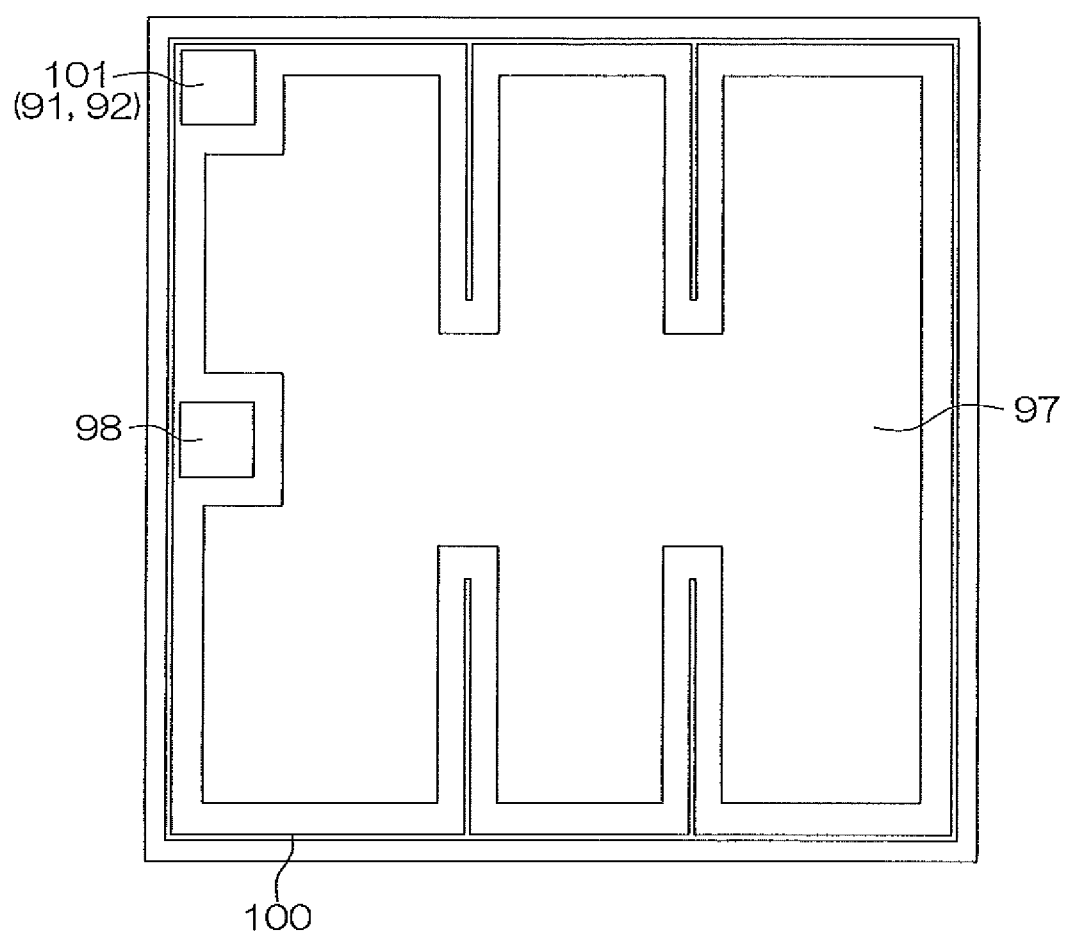
FIG. 8 is a plan view showing a structural example of a MOSFET device constituting each of first and second compound semiconductor MOSFETs having current detection portions.

FIG. 8 is a plan view showing a structural example of a MOSFET device constituting each of the first and second compound semiconductor MOSFETs 11 and 12 having the current detection portions 91 and 92. A metal film 97 forming a source electrode on a surface of a chip is formed generally over the whole region of one major surface of the chip. Another metal film 98 constituting a gate electrode of an islandlike region insulated from the metal film 97 is formed on the major surface of the chip. The metal film 98 is arranged around the center of one side of the chip having a rectangular shape in plan view in the example shown in FIG. 8. The gate metal film 98 is electrically connected to a polysilicon gate formed in the chip through a wiring pattern 100 referred to as a gate finger. The wiring pattern 100 may be a polysilicon wire formed in the same step as the polysilicon gate to be connected to the polysilicon gate, for example. In the example shown in FIG. 8, the wiring pattern 100 has an annular portion formed over the whole outer peripheral portion of the chip having the rectangular shape in plan view and two pairs of parallel straight portions extending inward from two opposed sides of the annular portion.

A metal film 101 for current detection insulated from the metal films 97 and 98 is further formed on the major surface of the chip. The metal film 101 is connected to source regions of partial unit cells C included in a large number of unit cells C (see FIGS. 4 and 5) formed in the chip. Among the unit cells C formed in the chip, two hundred thousand unit cells C (main cells) are connected to the source metal film 97, and 100 unit cells C are connected to the current detection metal film 101, for example. In this case, it follows that a current of 1/2000 of that flowing in the two hundred thousand main cells flows in the current detection metal film 101. Therefore, the current flowing in the two hundred thousand main cells (the source metal film 97) can be indirectly detected by detecting the current flowing in the current detection metal film 101. It follows that the current detection metal film 101 is connected to the overcurrent protection circuit 90 through the current detection terminals 93 and 94 (see FIG. 7).

Figure 9A:
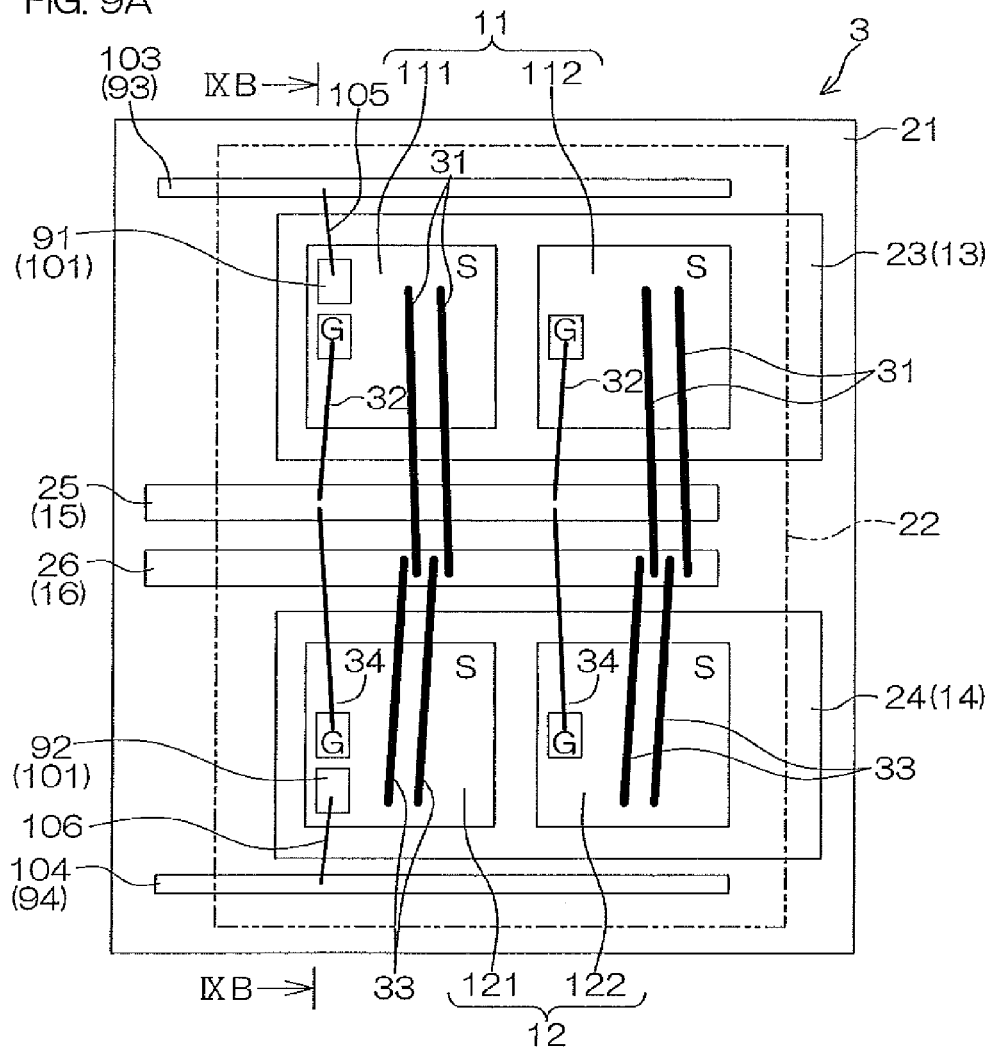
FIG. 9A is a schematic plan view for illustrating a first structural example of the AC switch according to the third embodiment.
Figure 9B:
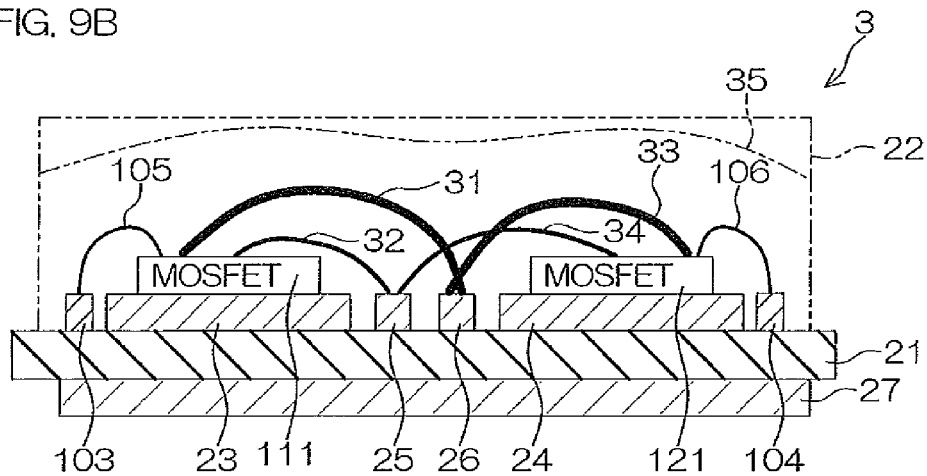
FIG. 9B is a schematic sectional view showing a cutting plane taken along a cutting plane line IXB-IXB in FIG. 9A.

FIG. 9A is a schematic plan view for illustrating a first structural example of the AC switch 3 according to the third embodiment. FIG. 9B is a schematic sectional view showing a cutting plane taken along a cutting plane line IXB-IXB in FIG. 9A. Referring to FIGS. 9A and 9B, portions corresponding to those shown in FIGS. 2A and 2B are denoted by the same reference numerals.

On an insulating substrate 21, a first current detection metal pattern 103 is formed on a side of a first drain metal pattern 23 opposite to a gate metal pattern 25 and a source metal pattern 26. The first current detection metal pattern 103 has a long rectangular shape extending parallelly to the first drain metal pattern 23, and is drawn out of a case 22 on a side opposite to a position of the first drain metal pattern 23 drawn out of the case 22. The first current detection metal pattern 103 corresponds to the aforementioned current detection terminal 93.

On the insulating substrate 21, a second current detection metal pattern 104 is further formed on a side of a second drain metal pattern 24 opposite to the gate metal pattern 25 and the source metal pattern 26. The second current detection metal pattern 104 has a long rectangular shape extending parallelly to the second drain metal pattern 24, and is drawn out of the case 22 on a side opposite to a position of the second drain metal pattern 24 drawn out of the case 22. The second current detection metal pattern 104 corresponds to the aforementioned current detection terminal 94.

In the first structural example, a current detection portion 91 (the current detection metal film 101) is provided on only one device 111 in a plurality of first compound semiconductor MOSFET devices 111 and 112 stored in the case 22. The current detection portion 91 is connected to the first current detection metal pattern 103 by a bonding wire 105. Similarly, a current detection portion 92 (the current detection metal film 101) is provided on only one device 121 in second compound semiconductor MOSFET devices 121 and 122. The current detection portion 92 is connected to the second current detection metal pattern 104 by a bonding wire 106.

A fixing material 35 arranged in the case 22 is so provided in the case 22 as to also seal the bonding wires 105 and 106.

Figure 10A:
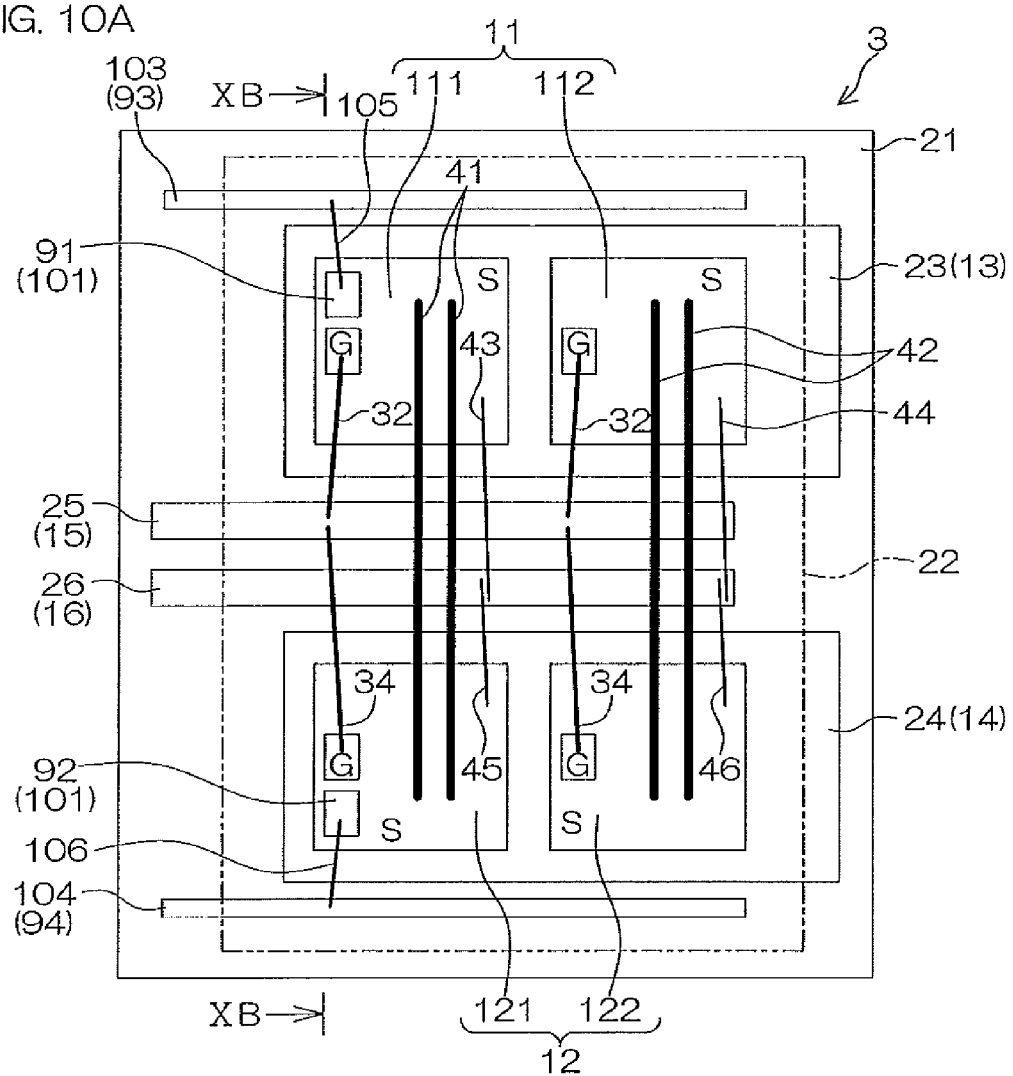
FIG. 10A is a schematic plan view for illustrating a second structural example of the AC switch according to the third embodiment.
Figure 10B:
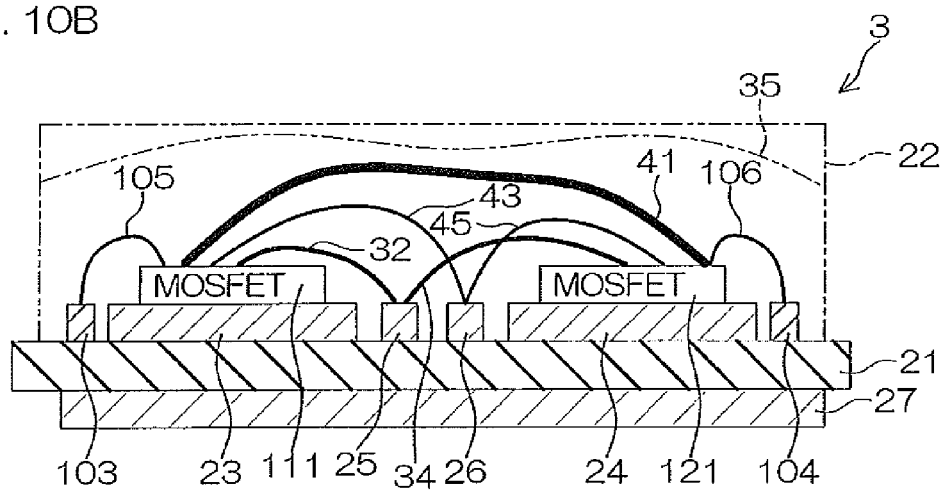
FIG. 10B is a schematic sectional view showing a cutting plane taken along a cutting plane line XB-XB in FIG. 10A.

FIG. 10A is a schematic plan view for illustrating a second structural example of the AC switch 3 according to the third embodiment. FIG. 10B is a schematic sectional view showing a cutting plane taken along a cutting plane line XB-XB in FIG. 10A. Referring to FIGS. 10A and 10B, portions corresponding to those shown in FIGS. 3A and 3B and FIGS. 9A and 9B are denoted by the same reference numerals.

The second structural example is similar in structure to the aforementioned second structural example of the AC switch 1 according to the first embodiment. In other words, opposed ones of first compound semiconductor MOSFET devices 111 and 112 and second compound semiconductor MOSFET devices 121 and 122 are connected with one another by bonding wires 41 and 42. Gate terminals of the MOSFET devices 111, 112, 121 and 122 are connected to a gate metal pattern 25 by bonding wires 43 and 46. The remaining structure of the second structural example is similar to that of the first structural example shown in FIGS. 9A and 9B.

As shown by phantom lines in FIG. 7, the overcurrent protection circuit 90 is preferably stored in the case 22, along with the remaining components of the AC switch 3. Thus, an AC switch module having an overcurrent protection function can be reduced in size.

In the third embodiment, the overcurrent protection circuit 90 may further have the current control function described with reference to the second embodiment. Thus, a rush current in conduction of the current path between the first and second output terminals 13 and 14 can be limited, for example.

While three embodiments of the present invention have been described, the present invention may be embodied in other ways. For example, while the n-channel MOSFET devices have been illustrated in each of the aforementioned embodiments, a similar AC switch may include p-channel MOSFET devices employing a compound semiconductor. In this case, the conductivity types of the semiconductor portions may be inverted between the n- and p-types in the structure shown in FIG. 4 or 5. While the device structure obtained by arraying the unit cells C has been illustrated in each of the aforementioned embodiments, a device structure obtained by parallelly arranging a plurality of zonal unit cells in a striped manner may alternatively be employed. While SiC semiconductor devices have been mainly employed in each of the aforementioned embodiments, devices made of another compound semiconductor such as GaN may alternatively be employed.

While the current control circuit 85 or the overcurrent protection circuit 90 is stored in the case 22 in the aforementioned second or third embodiment, the current control circuit 85 or the overcurrent protection circuit 90 may alternatively be arranged outside the case 22.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The present application corresponds to Japanese Patent Application No. 2010-128002 filed in the Japan Patent Office on Jun. 3, 2010, and the entire disclosure of the application is incorporated herein by reference.

What is claimed is:

1. An AC switch comprising:
   a first compound semiconductor MOSFET and a second compound semiconductor MOSFET whose sources are connected with each other,
   the first compound semiconductor MOSFET including
      a current detection portion for detecting a conduction current,
      the current detection portion being included within a device structure of the first compound semiconductor MOSFET,
   the first compound semiconductor MOSFET and the second compound semiconductor MOSFET being planar MOSFETs or trench gate MOSFETs,
   the first compound semiconductor MOSFET having a first body diode with an anode and a cathode respectively connected to a source and a drain of the first compound semiconductor MOSFET,
   the second compound semiconductor MOSFET having a second body diode with an anode and a cathode respectively connected to a source and a drain of the second compound semiconductor MOSFET;
   a first output terminal connected to the drain of the first compound semiconductor MOSFET;
   a second output terminal connected to the drain of the second compound semiconductor MOSFET;
   a first metal pattern electrically connected to the source of the first compound semiconductor MOSFET; and
   a second metal pattern
      separated from the first metal pattern and
      electrically connected to
         the current detection portion and
         the source of the first compound semiconductor MOSFET,
   wherein a withstand voltage between the first output terminal and the second output terminal in an off state is not less than 400 V, and
   wherein a resistance between the first output terminal and the second output terminal in an on state is not more than 20 m$\Omega$.

2. The AC switch according to claim 1, wherein
   the first compound semiconductor MOSFET and the second compound semiconductor MOSFET are SiC-MOSFETs employing SiC as a compound semiconductor.

3. The AC switch according to claim 1, further comprising a current control circuit connected to a gate of the first compound semiconductor MOSFET and a gate of the second compound semiconductor MOSFET.

4. The AC switch according to claim 3, wherein
   the current control circuit is arranged to gradually change a control voltage supplied to the gates of the first compound semiconductor MOSFET and the second compound semiconductor MOSFET.

5. The AC switch according to claim 1, wherein
   the current detection portion includes a terminal to which a source current is partially shunted, the terminal being provided within the device structure.

6. The AC switch according to claim 1, further comprising an overcurrent protection circuit supplying a current reduction signal to gates of the first compound semiconductor MOSFET and the second compound semiconductor MOSFET in response to a current, detected by the current detection portion, exceeding a set value.

7. The AC switch according to claim 5, wherein
   the first compound semiconductor MOSFET and the second compound semiconductor MOSFET as well as the overcurrent protection circuit are stored in one module case.

8. An AC switch comprising:
   a first compound semiconductor MOSFET and a second compound semiconductor MOSFET whose sources are connected with each other;
   a first output terminal connected to a drain of the first compound semiconductor MOSFET;
   a second output terminal connected to a drain of the second compound semiconductor MOSFET;
   a first metal pattern electrically connected to a source of the first compound semiconductor MOSFET; and
   a second metal pattern separated from the first metal pattern,
   wherein the first compound semiconductor MOSFET has a number of unit cells, and
   wherein only a portion of the number of unit cells include
      a current detection portion for detecting a current proportional to a conduction current of the first compound semiconductor MOSFET, and
      the current detection portion
         is provided within a device structure of the first compound semiconductor MOSFET and
         is electrically connected to
            the second metal pattern and
            the source of the first compound semiconductor MOSFET.

9. The AC switch according to claim 8, wherein
   the current detection portion includes a terminal to which the portion of the number of unit cells are connected such that a source current is partially shunted, and the terminal is provided within the device structure.

10. The AC switch according to claim 8, further comprising an overcurrent protection circuit supplying a current reduction signal to gates of the first compound semiconductor MOSFET and the second compound semiconductor MOSFET in response to a current, detected by the current detection portion, exceeding a set value.

11. The AC switch according to claim 10, wherein
the first compound semiconductor MOSFET and the second compound semiconductor MOSFET as well as the overcurrent protection circuit are stored in one module case.

12. An AC switch comprising:
a first compound semiconductor MOSFET and a second compound semiconductor MOSFET whose sources are connected with each other;
a first output terminal connected to a drain of the first compound semiconductor MOSFET;
a second output terminal connected to a drain of the second compound semiconductor MOSFET;
a first diode having an anode and a cathode respectively connected to the source and the drain of the first compound semiconductor MOSFET;
a second diode having an anode and a cathode respectively connected to the source and the drain of the second compound semiconductor MOSFET;
a first metal pattern electrically connected to a source of the first compound semiconductor MOSFET; and
a second metal pattern separated from the first metal pattern,
wherein the first compound semiconductor MOSFET has a number of unit cells, and
wherein only a portion of the number of unit cells include
a current detection portion for detecting a current proportional to a conduction current of the first compound semiconductor MOSFET, and
the current detection portion
is provided within a device structure of the first compound semiconductor MOSFET and
is electrically connected to
the second metal pattern and
the source of the first compound semiconductor MOSFET.

13. The AC switch according to claim 12, wherein the second metal pattern is formed at a periphery of the device structure.

14. The AC switch according to claim 12, wherein the first diode is a body diode of the first compound semiconductor MOSFET, and the second diode is a body diode of the second compound semiconductor MOSFET.

15. The AC switch according to claim 12,
wherein the first metal pattern is commonly connected to the respective sources of the first and second compound semiconductor MOSFETs.

16. The AC switch according to claim 12, further comprising a sealing material commonly sealing the first and second compound semiconductor MOSFETs.

* * * * *